US008424265B2

(12) United States Patent
Lusk

(10) Patent No.: US 8,424,265 B2
(45) Date of Patent: Apr. 23, 2013

(54) SHAPE-SHIFTING SURFACES

(75) Inventor: Craig Perry Lusk, Lutz, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 13/302,606

(22) Filed: Nov. 22, 2011

(65) Prior Publication Data

US 2012/0067529 A1  Mar. 22, 2012

Related U.S. Application Data

(63) Continuation of application No. PCT/US2011/044370, filed on Jul. 18, 2011.

(60) Provisional application No. 61/365,164, filed on Jul. 16, 2010.

(51) Int. Cl.
E04H 12/18 (2006.01)
E04H 9/00 (2006.01)
E04H 14/00 (2006.01)
E04H 9/02 (2006.01)

(52) U.S. Cl.
USPC .................. 52/646; 52/1; 52/167.2; 160/236

(58) Field of Classification Search .............. 52/1, 2.11, 52/645, 646, 167.1, 167.2, 167.3, 167.4, 52/167.6, 167.7, 167.8; 160/236; 428/12; 434/365
See application file for complete search history.

(56) References Cited

U.S. PATENT DOCUMENTS 5,642,590 A * 7/1997 Skelton .......................... 52/81.1
5,727,391 A * 3/1998 Hayward et al. ................ 60/528
7,013,608 B2 * 3/2006 Newland ......................... 52/146
7,578,307 B2 * 8/2009 Ung et al. ...................... 135/128
2004/0249582 A1 12/2004 Allen et al.
2004/0261351 A1 * 12/2004 Ung et al. ....................... 52/693
2006/0285758 A1 12/2006 Marugame
2008/0269948 A1 10/2008 Solomon
2009/0263615 A1 * 10/2009 Lanahan ......................... 428/80
2010/0058704 A9 * 3/2010 Liew et al. ...................... 52/646

(Continued)

FOREIGN PATENT DOCUMENTS

JP 2005287846 10/2005
JP 2008-031604 * 2/2008

OTHER PUBLICATIONS

Jensen, B. D.; Howell, L. L. Identification of Compliant Pseudo-Rigid-Body Four-Link Mechanism Configurations Resulting in Bistable Behavior. Journal of Mechanical Design. Dec. 2003, vol. 125, pp. 701-708.
Howell, L. L. Compliant Mechanisms. 2001, Chapter 11, pp. 355-397.

(Continued)

*Primary Examiner* — Mark Wendell
(74) *Attorney, Agent, or Firm* — Nilay J. Choksi; Smith & Hopen, P.A.

(57) ABSTRACT

Shape-shifting surfaces that retain their effectiveness as physical barriers while undergoing changes in shape. The shape changes include any motion that makes the surface more effective at performing its function, such as expansion, shrinkage, twisting, encircling, wiggling, swallowing or constricting. The shape-shifting surfaces include tiled arrays of polygonal cells, each cell including specifically-designed compliant flexures attached to specifically-shaped overlapping thin plates or shells. Applications for such surfaces include micro-scale cellular engineering and macro-scale biomedical applications, recreational uses, national security, and environmental protection.

22 Claims, 10 Drawing Sheets

U.S. PATENT DOCUMENTS

| | | | |
|---|---|---|---|
| 2010/0077674 A1* | 4/2010 | Johnson et al. | 52/81.1 |
| 2010/0133749 A1* | 6/2010 | Houlis | 273/153 S |
| 2011/0005160 A1* | 1/2011 | Nihei | 52/645 |
| 2012/0028743 A1* | 2/2012 | Muldoon et al. | 473/612 |

OTHER PUBLICATIONS

Wicks, N.; Hutchinson, J. W. Sandwich Plates Actuated by a Kagome Planar Truss. Transactions of the ASME. Sep. 2004, vol. 71, pp. 652-662.

Dos Santos E Lucato, S. L.; Wang, J.; Maxwell, P.; McMeeking, R. M.; Evans, A. G. Design and demonstration of a high authority shape morphing structure. International Journal of Solids and Structures. 2004, vol. 41, pp. 3521-3543.

Jensen, B. D.; Howell, L. L. Identification of Compliant Pseudo-Rigid-Body Mechanism Configurations Resulting in Bistable Behavior. ASME 2000 Design Engineering Technical Conferences and Computers and Information in Engineering Conference, Baltimore, Maryland, Sep. 10-13, 2000.

International Search Report and Written Opinion issued on Mar. 28, 2012 in corresponding international patent application No. PCT/US2011/044370 with an international filed of Jul. 18, 2011.

* cited by examiner

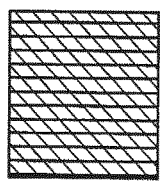 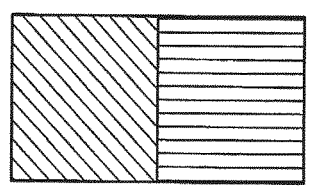 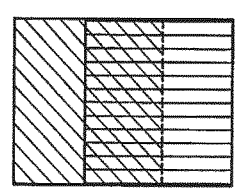
FIG. 3A   FIG. 3B   FIG. 3C
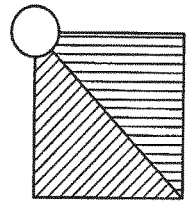 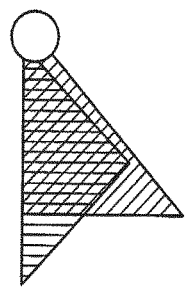 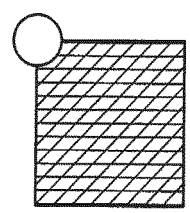
FIG. 4A   FIG. 4B   FIG. 4C
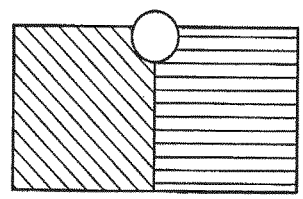
FIG. 4D

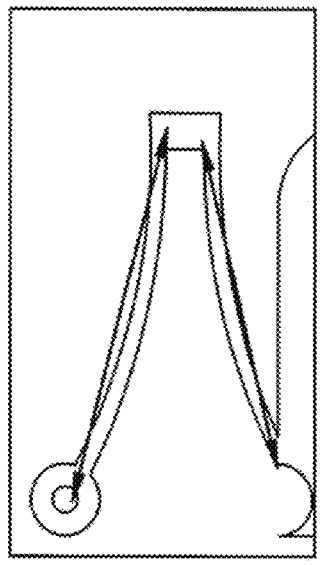
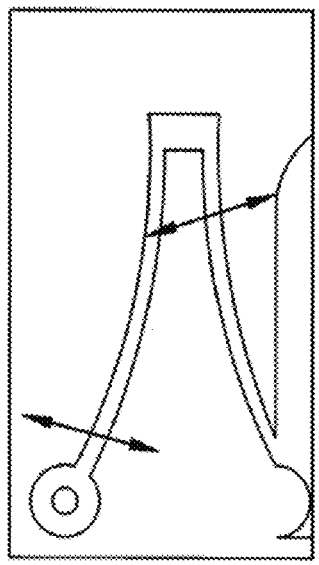
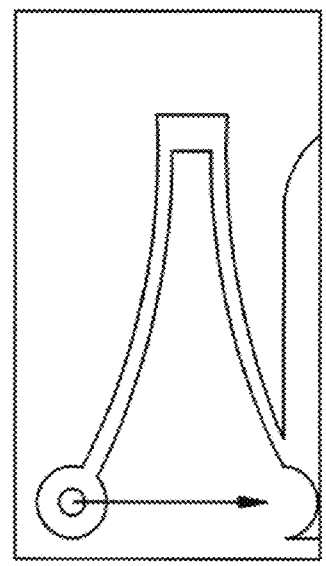
*FIG. 6D*  *FIG. 6E*  *FIG. 6F*
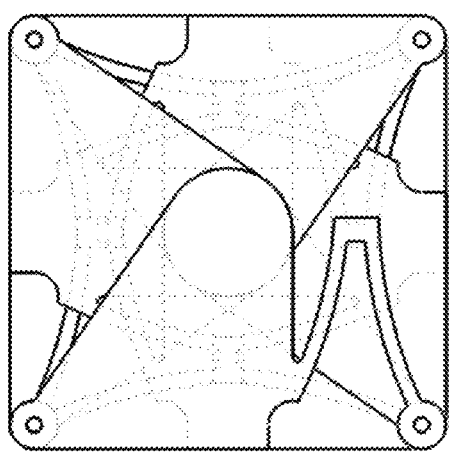
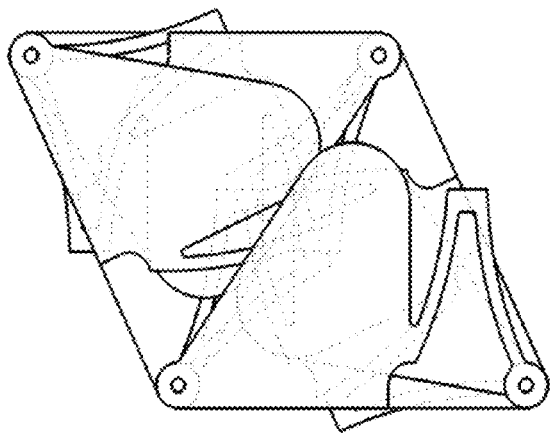
*FIG. 7A*  *FIG. 7B*

SHAPE-SHIFTING SURFACES

CROSS-REFERENCE TO RELATED APPLICATIONS

This application is a continuation of prior filed international application Ser. No. PCT/US2011/044370, entitled Shape-Shifting Surfaces, filed Jul. 18, 2011, which is a continuation of and claims priority to provisional patent application No. 61/365,164, entitled Design for Integrity in Shape-Shifting Surfaces, filed Jul. 16, 2010 by the same inventor.

BACKGROUND OF THE INVENTION

1. Field of the Invention

This invention relates, generally, to surfaces the shape of which can be changed in response to externally applied forces. More particularly, it relates to such surfaces that are dynamic and controllable.

2. Description of the Prior Art

A compliant mechanism is a flexible mechanism, known to the art, that transfers an input force or displacement from one point to another through elastic body deformation. These mechanisms are most commonly designed in two ways. One is using pseudo-rigid-body models, and the other is using topology optimization. Both approaches have utility. The design of the compliant portion of the unit cell components is accomplished through compliant mechanism synthesis.

There are three major approaches to the design and synthesis of compliant mechanisms kinematic approximation methods, computationally intense methods, and linear and higher-order expansions of the governing equations. This disclosure is based primarily upon kinematic approximation methods.

The kinematic approximation or Pseudo-Rigid-Body Model (PRBM) approach works by identifying similarities between compliant mechanisms and rigid-body mechanisms. It has proved effective in identifying numerous compliant analogues to ubiquitous planar rigid-body mechanisms such as four-bar and crank-slider mechanisms. The chief criticisms of this approach are that the models are approximate and have limited, albeit known, accuracy. Moreover, the identification between flexure geometries and rigid-body mechanisms has been limited to a small but versatile set of planar configurations.

Computationally intense approaches typically combine finite element analysis with optimization to calculate optimal geometries in response to load and motion specifications. This approach has been successful, but has also been criticized for producing results identical to those produced more quickly by the PRBM approach, or results that are not physically realizable. As a general rule, this approach is more capable and accurate than the PRBM approach, but also more time consuming.

The third approach, which relies on linear and higher-order expansions of the governing equations, is well-known in precision mechanisms research, and relies heavily on flexures that are small and undergo small, nearly linear, deflections. This approach uses flexures much smaller than the overall mechanism size so it is not generally applicable to millimeter-scale and smaller mechanisms. These techniques are important but do not have a direct bearing on the invention disclosed herein.

Systems for subdividing surfaces in the development of finite element algorithms using node definition and degrees of freedom are known. These same subdivisions schemes are applicable to the design of the novel shape-shifting surfaces disclosed hereinafter. The prior art includes techniques for node placement in a given shape. For example, In Finite Element models, the behavior between nodes is typically determined by interpolating functions. In the shape-shifting system disclosed hereinafter, a kinematic scheme is required to fill the gaps between nodes. Thus, kinematic skeletons are developed which have the same number of nodes (typically revolute joints) and the same number of degrees of freedom. Methods for enumerating all possible kinematic linkages with a given number of degrees of freedom are known. The simplest systems satisfying degree of freedom requirements are preferred. For example, triangular elements with additional nodes along the edges and center-point nodes are known.

Tiling systems, periodic and aperiodic, are methods for subdividing surfaces and as such have been extensively studied by mathematicians and artists since antiquity. The three regular tilings are: 1) equilateral triangles only, 2) squares only, and 3) regular hexagons only. There are eight Archimedian tilings, and there are aperiodic Penrose kite-and-dart tiling systems. The regular tilings are simple and require the fewest different types of unit cells. Some of the Archimedian tilings use polygons with several sides, yielding generous angles and areas to work with, which may be advantageous. Penrose tiles are specifically shaped quadrilaterals that can be assembled in multiple, non-periodic ways.

In 1827, Carl Fredrich Gauss published his 'Theorema Egregium' which is the foundational result in differential geometry. The basic result is that small triangles do not change their shape when bent and that there is a fundamental difference in the shape of triangles that are planar (the sum of the angles is equal to 180 degrees) and the shape of triangles on a sphere (the sum of the angles is always more than 180 degrees) and the shape of triangles on a hyperbolic or saddle-shaped surface (the sum of the angles is always less than 180 degrees). His result means that spheres cannot be made into planes without crumpling or tearing or stretching (distorting) the surface. This fundamental geometric limitation makes the building of certain types of curved surfaces (those with two non-zero principal curvatures) intrinsically more difficult than working with planar surfaces (both principal curvatures equal to zero) or developable surfaces (one principal curvature equal to zero).

This leads to a need for innovation that allows conventional surfaces to achieve new functionality, to be constructed more precisely, or at lower cost. More particularly, a low-cost modular building system with customizable degrees-of-freedom and stiffness is needed. In addition to potential savings when a new barrier is erected, an innovative system would provide new methods and functionality to surfaces and objects.

Objects that function as physical barriers or supporting surfaces include walls, table tops, shelves, floors, ceilings, stairs, vehicle bodies, and pipelines. Conventional methods for constructing these barriers can be costly, but even when they are inexpensive, the numbers of these kinds of objects mean that they represent a significant economic investment. Such barriers often incur additional costs when they require modification or removal. Thus there is a need for a surface, and a method for designing such surface, having a shape that may be modified or adjusted without damaging the surface or rebuilding it.

However, in view of the art considered as a whole at the time the present invention was made, it was not obvious to those of ordinary skill how said art could be advanced.

SUMMARY OF THE INVENTION

The novel shape-shifting surfaces disclosed herein may include a single polygonal cell structure comprising multiple side members that have compliant flexures and plate or shell segments. The side members are attached at nodes to form structures that retain their effectiveness as physical line of sight barriers while undergoing changes in shape such as expansion, shearing, shrinkage, twisting, vibrating, encircling, wiggling, swallowing or constricting.

The single polygonal cell structures may include overlapping thin plates, overlapping thin shells, or both.

The novel shape-shifting surfaces may also be formed of a tiled array of polygonal cells including compliant flexures attached to structures that retain their effectiveness as physical barriers while undergoing changes in shape such as expansion, shearing, shrinkage, twisting, vibrating, encircling, wiggling, swallowing or constricting. Such structures, when joined to multiple other cell structures, may further include a specific final shape such as a sphere, cuboctohedron, or other spatial structures.

Said tiled array structures may further include an initial planar structure and a specific final shape such as a sphere, cuboctohedron, or other spatial structures formed of compliant mechanisms including planar and non-planar compliant mechanisms.

The novel shape-shifting structure may further include a truncated icosahedron having planar or spherical faces, or both.

The novel method of incorporating shape-shifting surfaces in existing design tools includes the step of modeling a shape-shifting system cell using a single finite element for each unit cell, with material properties that are a known modification of the material used to fabricate the compliant portion of the unit cell so that a well-characterized shape-shifting system relates the properties of a unit cell to the properties of a geometrically similar element of bulk material.

An important object of this invention is to disclose shape-shifting surfaces, i.e., surfaces that retain their effectiveness as a physical barrier while undergoing changes in shape and which maintain the relative integrity of a surface while changing the size of the area they cover.

There are different levels of barrier effectiveness such as line-of-sight (or radiation) barriers. Water-tight barriers and air-tight barriers may be achievable with the right choice of material, although it might be required to add layers that stretch, fold and perhaps crumple in order to accommodate the shape-changes.

Another object is to provide shape-shifting surfaces that provide changes in shape including expansion, shrinkage, twisting, encircling, swallowing, and constricting motions that make the surface more effective at performing its function.

Another object is to disclose compliant mechanisms that enable motion and provide a stable 'default' shape for a surface.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the nature and objects of the invention, reference should be made to the following detailed disclosure, taken in connection with the accompanying drawings, in which:

FIG. 3A depicts minimum area coverage of two identical squares;

FIG. 3B depicts maximum area coverage;

FIG. 3C depicts the preferred starting position, minimizing the deformation required to achieve both states of FIGS. 4A and 4B;

FIG. 4A depicts the smallest angles two links covering a square can have, allowing maximum contraction of the angle;

FIG. 4B depicts the ninety degree (90°) square corner of FIG. 4A compressed to forty five degrees (45°);

FIG. 4C depicts the corner members when they completely overlap;

FIG. 4D depicts the largest angles two links covering a square can have, representing the maximum expansion of the angle;

FIG. 6D depicts the bendable part of said compliant link with arrows depicting the direction of principle stiffness;

FIG. 6E depicts the bendable part of said compliant link with arrows depicting the direction of principle compliance;

FIG. 6F depicts the bendable part of said compliant link with arrows depicting how the node stays substantially on a straight line when said bendable part is displaced;

FIG. 7A depicts an unstressed square unit cell;

FIG. 7B depicts the unit cell with shear loads;

DETAILED DESCRIPTION OF THE PREFERRED EMBODIMENT

A shape-shifting surface, a coined term, is a novel flat or curved surface that can change its shape (including its area and the orientation of internal lines) while maintaining integrity against various forms of external assaults. Shape-shifting surfaces have potential utility in products as diverse as containers, shielding, furniture, architectural elements, clothing, exercise equipment, and children's toys.

Shape-shifting surfaces may also have applications in the fields of reconfigurable robotic systems such as claytronics, programmable matter, and digital clay. An important distinction is that shape-shifting surfaces are functional without any actuation. Shape-shifting surfaces include compliant mechanisms so a rich variety of passive behaviors can be designed into them without the inherent expense of large numbers of actuators and processors.

The novel shape-shifting surface concept disclosed herein offers the first plausible workaround to Guass's result: shape-shifting surfaces can change their area because they have multiple layers which can slide with respect to each other. Thus, it functions as an integral surface, and can satisfy many of the practical expectations that we have of surfaces, but because of the multiplicity of layers it provides functionality that is not seen in any other structure or mechanism. Thus, a spherical globe made of shape-shifting surfaces could potentially be opened and pressed flat into a flat map. The gaps (or tears) that would open in a conventional surface (e.g. typical cardboard or metal globes) would be filled by underlying layers being revealed as the surface was stretched flat. Because the stretching motions in a shape-shifting surface are controlled by elastic members, the stretching motions are reversible.

The passive functionality of a shape-shifting surface is a functionality that is designed in due to the geometry and material properties of the shape-shifting surface, and that does not require electronic sensors or actuators to achieve. As a new design paradigm, shape-shifting surfaces may be components in improved reconfigurable robotic systems.

Figure 1:
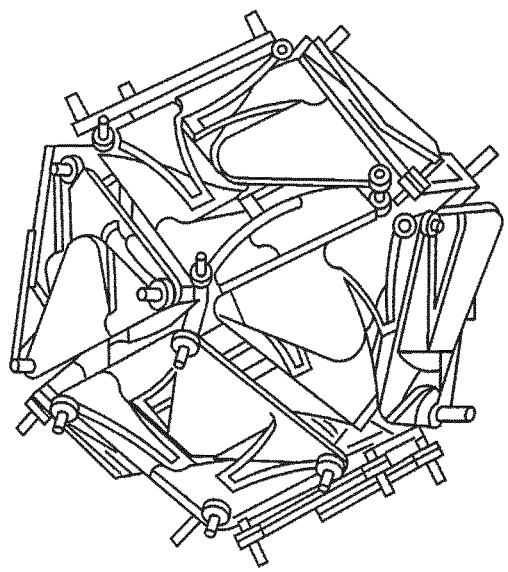
FIG. 1 depicts a foldable and deformable polyhedral (cuboctohedral) container made of shape shifting surfaces.

This disclosure discloses three design concepts associated with shape-shifting surfaces: 1) Characterizing a shape-shifting surface unit cell as a finite element, thereby enhancing the feasibility of integrating the shape-shifting surface into existing designs and simplifying its analysis; 2) Establishing a kinematic and structural basis for shape-shifting, i.e., deforming the geometry of each cell, and using a rigid-body-replacement technique to identify compliant mechanisms with motions consistent with the kinematic structure; and 3) The integration of unit cells into complex polygonal surfaces and shapes such as a cube or cuboctahedron, as depicted in FIG. 1.

Modeling the unit cell as a finite element requires consideration of design space characterization of the shape-shifting system, node definition and degrees of freedom, and periodic or aperiodic tiling systems. Concerning design space considerations, designers are more likely to use a design innovation if it can be easily integrated into existing software and design procedures. Accordingly, the design space allows shape-shifting system designs to be easily assessed using existing tools. This is achievable because a shape-shifting system cell can be modeled using a single finite element for each unit cell, with material properties that are a known modification of the material used to fabricate the compliant portion of the unit cell. Thus, a well-characterized shape-shifting system relates the properties of a unit cell to the properties of a geometrically similar element of bulk material. For example, an initial polypropylene cell prototype, designed for minimal stiffness, has one-fourth the density and $\frac{1}{1500}^{th}$ the in-plane stiffness of a uniform block of polypropylene with equal area and thickness. The ratio between the properties of the shape-shifting system cell and the bulk material allows designers to test concepts in standard design software using modified material properties.

A shape-shifting surface has a specific initial shape but is made of a material that accommodates deformation of that shape in order to produce the desired shape-shifting property. There may be a specific initial shape, i.e., a planar arrangement such as an ellipse and a different specific final shape, i.e., a spatial figure such as a sphere or cuboctohedron as depicted in FIG. 1.

Shape-shifting surfaces have multiple sub-components; accordingly, elastic members are necessary to give them a default shape. Without such elastic members, shape-shifting surfaces are too vulnerable to gravity and would collapse under their own weight.

Based on the properties of small triangular areas, mathematicians have recognized three basic categories of surfaces: hyperbolic surfaces, spherical surfaces and planar surfaces. Each type of surface can generally be subdivided into regular polygonal areas. Each of these regular polygons can be taken as a unit cell for the purposes of design. Systems of tiling for the three types of surfaces include regular, Archimedean, and Penrose tiling systems. Computer algorithms for generating these tiling systems are adapted for use in describing shape-shifting surfaces.

The design of shape shifting surfaces may be accomplished using the approach taken in finite element analysis where the vertices of the unit cells are taken as nodes. For example, a simple planar square unit cell has four nodes, each node with two translational degrees of freedom, yielding eight degrees of freedom for the unit cell.

Figure 2A:
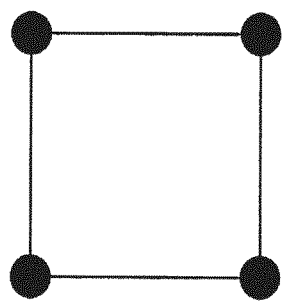
FIG. 2A depicts a square unit cell with four nodes.
Figure 2B:
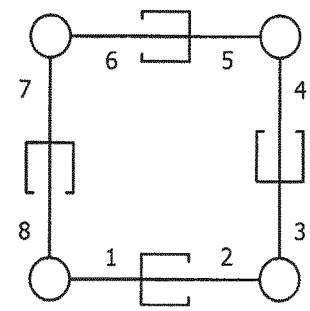
FIG. 2B depicts an eight-link kinematic skeleton model with the same number of degrees of freedom as the model of FIG. 3A.

Given the unit cell shape and its required degrees of freedom, kinematic skeleton models are constructed that result in the nodes having appropriate relative freedoms. A nodal model and a simple kinematic model, consisting of links, revolute joints and sliding joints, are depicted in FIGS. 2A and 2B, respectively. Connecting nodes with RPR (revolute, prismatic, revolute) joints allow complete freedom of motion between the nodes. More particularly, FIG. 2A depicts a square unit cell having four (4) nodes and FIG. 2B depicts an eight-link kinematic skeleton model having the same number of degrees of freedom.

A polygon has a finite number of straight sides joined at corners which are known as the nodes of the unit cell. For example, a square has four corners, so a square unit cell has four nodes as depicted in FIG. 2A. In the shape-shifting surface, each side of a unit cell may change its length, as represented by the "]" symbols in FIG. 2B, and each angle may increase or decrease as represented by the circle "o" symbol in FIG. 2B. Each node can move independently relative to the other nodes.

To define link shapes that preserve line-of-sight surface integrity, shapes are chosen for each of the links in the kinematic model so that as the links slide, rotate, and overlap, the unit cell serves, at the minimum, as a line-of-sight barrier for all points within the unit cell. At the same time, no piece of the links intrudes on adjacent unit cells, and the number of overlapping layers is minimized.

A graphical strategy permits designing link shapes with maximal motion range from the starting position. For the relative sliding motion of two squares, the minimum area of coverage occurs when they are coincident as depicted in FIG. 3A and the maximum area of coverage occurs when they are adjacent as depicted in FIG. 3B. An initial position of halfway between said extreme positions as shown in FIG. 3C is preferred because it permits the minimum deformation between minimum and maximum area coverage.

The length change of each side is accomplished by a design in which each side of the unit cell consists of two separate side members which can translate relative to each other as depicted in FIGS. 3A-C.

Furthermore, the link shapes may be described as side members of a unit cell. FIG. 3A depicts one extreme of the relative motion of the sides where the two side members completely overlap one another. FIG. 3B depicts the other extreme in which the two side members osculate, but do not overlap. The two side members can be designed to have their initial relative position anywhere between the extremes shown in FIG. 3A and FIG. 3B.

In deference to the stresses associated with moving compliant portions of the shape shifting surface, an intermediate design with half of each member overlapping the other member as depicted in FIG. 3C is selected to illustrate a design in which the length of a side can both increase and decrease. In this particular intermediate design, the distances, i.e., the amount of relative translation between the two members, to the extremes depicted in FIGS. 3A and 3B, are equal. This halfway position yields a two-thirds rule, i.e., by making each side member two-thirds of the total width of the unit cell, the range of motion for each side ranges from two-thirds (the minimum width) to four-thirds (the maximum width) of the original length of the unit cell.

The sides can be subdivided further if desired. If X is the minimum width, and n is the number of side members, then the maximum width is nX. The midpoint length, Y, is found by averaging the minimum and maximum widths, $Y=(X+nX)/2$. Thus, if the unit cell width is equated to be the midpoint length, Y, then the length of each side member is given by $X=2Y/(n+1)$. The range of motion for each side is then given by $R=2Y(n-1)/n+1$. This equation assumes a minimum of two members but it gives a correct result when n=1, i.e, with a single side member, the range of motion for a side becomes zero.

Figure 6A:
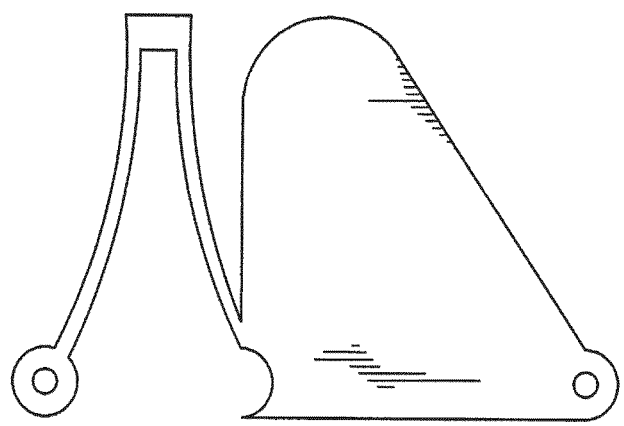
FIG. 6A depicts one of eight identical compliant links that makes a square unit cell.
Figure 6B:
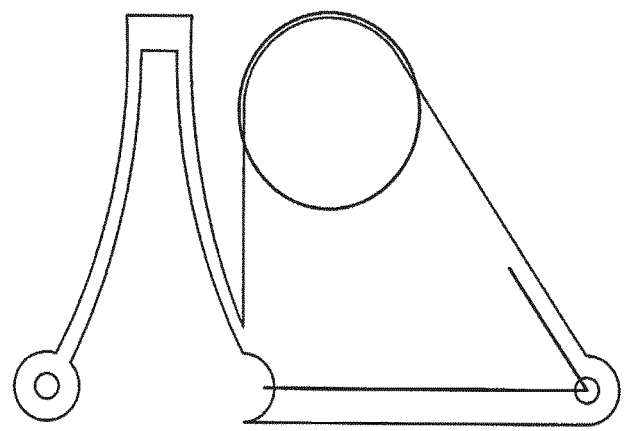
FIG. 6B depicts the compliant link of FIG. 6A but emphasizes its rounded corner.
Figure 6C:
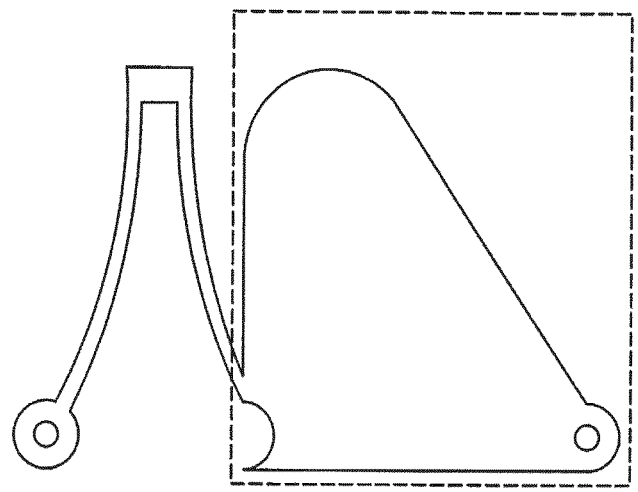
FIG. 6C depicts the compliant link of FIGS. 6A and 6B but emphasizes the part thereof that provides solid interior coverage without gaps or protrusions.

Rotations can be approached similarly. FIG. 4A depicts the minimum pair of angles on links that cover a square. FIG. 4B depicts the maximum angle that can be subtended by two links fitting into a square, and FIG. 4C depicts an intermediate design that fits into a square and permits both expansion and contraction of the angle marked with a small white circle. Combining the simple designs for sliding motion and rotation yields a link shape with sufficient overlaps to permit expansion, contraction and shearing motions, as illustrated in FIGS. 6 and 7.

Figure 5A:
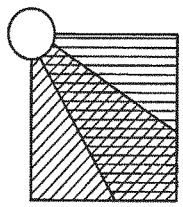
FIG. 5A depicts corners with equal capability to compress and expand.
Figure 5B:
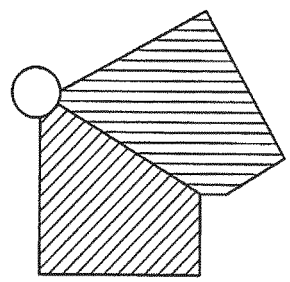
FIG. 5B depicts corners with equal capability to compress and expand.
Figure 5C:
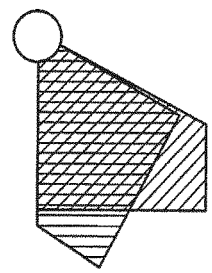
FIG. 5C depicts corners with equal capability to compress and expand.

Similar results can be obtained for the range of motion of a corner. A corner consisting of a single member is immobile, so two corner members, pinned at the corner can move with respect to each other. When two corner members are used, they can either osculate as shown in FIG. 4A, in which case they have the maximum capability to compress (e.g. the ninety degree (90°) square corner can compress to forty five degrees (45°) as depicted in FIG. 4B), or they can completely overlap as shown in FIG. 4C, in which case they have the maximum capability to expand. For example, the ninety degree (90°) square corner can expand to one hundred eighty degrees (180°) as shown in FIG. 4D. The two-thirds rule for sides can be used to obtain corners with equal capability to compress and expand, as depicted in FIGS. 5A, 5B, and 5C.

For a corner that is originally ninety degrees (90°), the two-thirds rule suggests two members with sixty degree (60°) corners. Thus, the corner can expand to one hundred twenty degrees (120°), and compress to sixty degrees (60°).

These design rules disclose how to design sides and angles that can compress and expand without developing gaps or without protruding past the nodes. Following these rules produces shape shifting surface members that provide good coverage and a range of motion without gaps in the shape shifting surface or protrusions outside of the unit cell.

To identify compliant mechanisms with motions consistent with the kinematic structure, kinematic models consisting of sliders and revolute joints are simplified and made easier to assemble by replacing rigid-link mechanisms with a compliant mechanism having the same motion. This process is known as compliant mechanism synthesis by rigid-body replacement.

A compliant mechanism depicted in FIG. 6, also referred to as a side member, includes a compliant flexure and a plate segment that functions as a link and slider. An assembled deformable square unit cell, constructed from multiple side members, is shown in FIGS. 7A-D, which illustrates the square undergoing compression, tension and shear. The amount of deflection that the compliant mechanism can achieve is dependent on the mechanism's geometry and the material properties.

Selecting a tiling scheme is one step of the design procedure for a shape shifting surface. The tiles may be of regular configuration such as equilateral triangles, squares, or regular hexagons. They may also be Archimedean or even non-periodic such as Penrose tiles. In general, the selected tiling scheme will include a finite number of polygonal shapes that are repeated to fill an area. The polygons used in the tiling schemes are used to design each of the unit cells of a shape-shifting surface.

Applying these design rules, suppose a square unit cell is chosen and that an application requires that each of the four sides and four corners must be able to expand and contract. The minimum number of side members for which this can be achieved is eight (8). Each side of the square unit cell is associated with two side members, and each corner is associated with two side members. The two-thirds rule is used to select the length of the side member and the angle of the member attached at the node (see FIG. 4). The rounded top (circled in FIG. 6B) of the side member closes the shape and is an interpolation that gives good coverage on the inside of the square and some aesthetic appeal, i.e., a rounded corner instead of a sharp one. The portion of the side member designed to provide solid interior coverage without gaps or protrusions is surrounded by a box in FIG. 6C with dashed lines.

The remaining portion of the shape shifting surface, i.e., the portion of the side member depicted in FIGS. 6D-F, is a compliant mechanism or compliant flexure. Its design guides the nodes on a straight-line path when said nodes are in motion.

The black arrows in FIG. 6D indicate the direction of principal stiffness for the members capable of bending, i.e., the directions in which motion requires the largest applied force. The arrows in FIG. 6E depict the directions of principal compliance for the bending members, i.e., the directions for which motion requires the least force. The net effect is motion of the node that stays substantially on the straight line connecting the original positions of the nodes as depicted in FIG. 6F.

There are a number of compliant mechanisms which can achieve the desired straight line motion. These can be designed using rigid-body replacement methodology. The fundamental principles include rigid-body mechanism techniques for straight-line mechanism design and rigid-body replacement methods to eliminate the need for joints and to give the mechanism stiffness or resistance to motion. The use of compliant members in the shape shifting surface design allows for motion with fewer parts and it provides a default or in repose shape to which the shape shifting surface tends to return when external forces are removed.

Figure 7C:
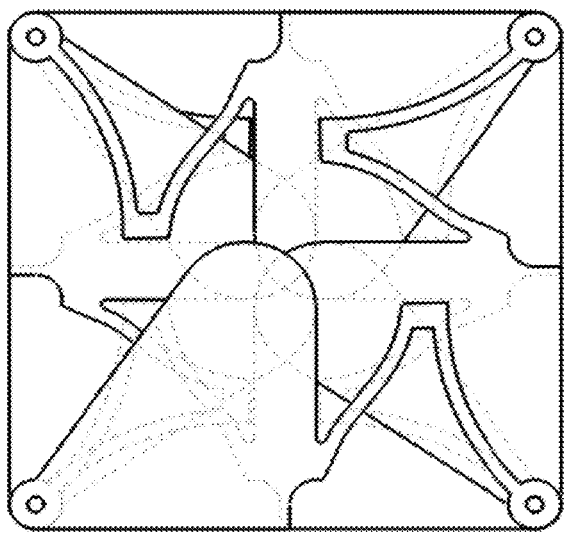
FIG. 7C depicts the unit cell in tension.
Figure 7D:
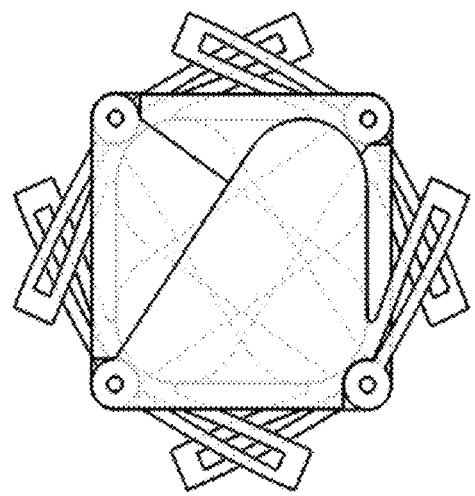
FIG. 7D depicts the unit cell in compression.
Figure 8A:
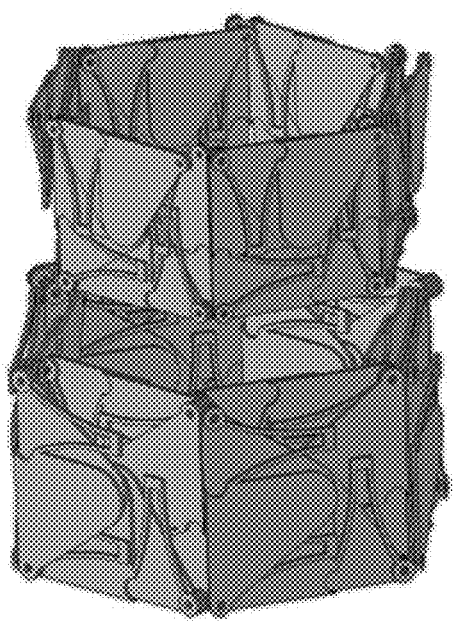
FIG. 8A depicts two rings of different size made from shape-shifting surface squares.
Figure 8B:
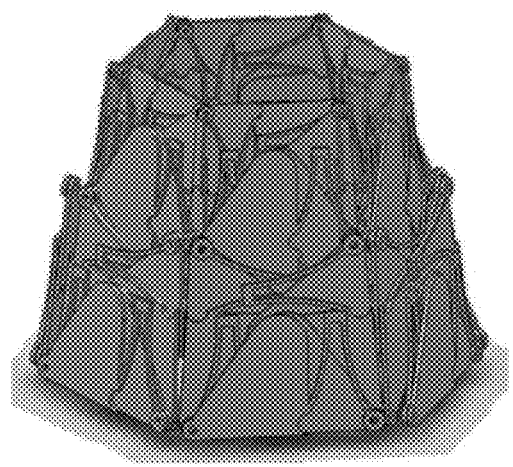
FIG. 8B depicts how the rings of FIG. 8A approximate a cone when joined to one another.

Eight side-members are assembled to form the square depicted in FIG. 7A which is a square unit cell. FIG. 7B shows the unit cell subjected to a shearing motion. FIG. 7C shows the unit cell expanded and FIG. 7D shows the unit cell compressed. All depicted images are at the same scale and the size difference between the unit cell depicted in FIGS. 7C and 7D is due to the motion of the side members and not enlargement of the Figures. Depending upon the application, adjacent unit cells are designed to limit motion by sharing nodes, or to increase mobility by having separate sets of nodes that may translate with respect to each other. Also, large-scale geometric effects are achieved by attaching dissimilar unit cells to each other in ways that put a first cell in tension and a contiguous second cell in compression. For example, a conical surface is created by attaching a smaller compliant ring to a larger one as depicted in FIGS. 8A and 8B. The ability to mate unit cells of dissimilar size enables a discrete set of unit cell sizes to provide the adequate geometric flexibility to build a wide variety of surfaces.

As depicted in FIGS. 8A and 8B, shape changes can be induced by joining unit cells of dissimilar size. Surfaces are developable if they can be formed by bending, but not stretching or compressing any part of a flat sheet. Shape-shifting surfaces with flexible boundaries between unit cells can be assembled to form developable surfaces such as the one depicted in FIGS. 8A and 8B.

Figure 9A:
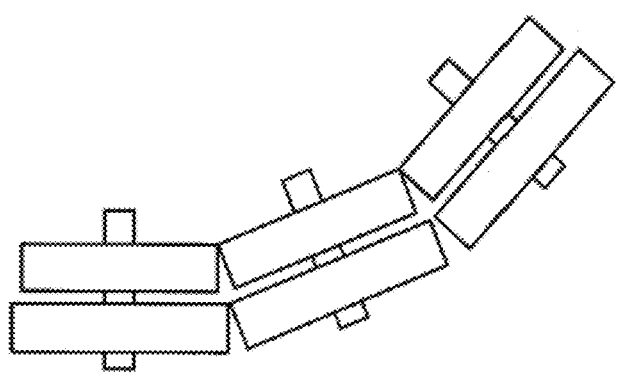
FIG. 9A is a side elevation view of unit cells arranged to produce an intrinsically curved shape-shifting surface via double layers of dissimilar size.
Figure 9B:
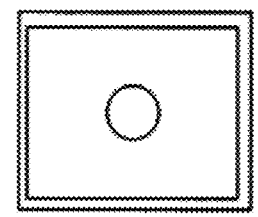
FIG. 9B is a top plan view of a unit cell pair that produces a spherical curvature when tiled.
Figure 9C:
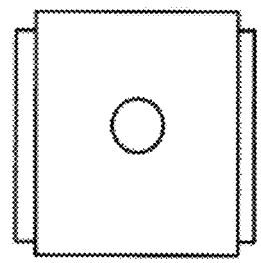
FIG. 9C is a top plan view of a unit cell pair that produces hyperbolic curvature.

The novel shape-shifting surfaces may have intrinsic curvature such as spheres and use elements produced using planar fabrication techniques. Double layers of shape-shifting surfaces unit-cells of dissimilar size as depicted in FIG. 9A are used in this example. The larger unit cells are attached to each other at the corners, as are the smaller unit cells. The larger unit cells are attached to the smaller unit cells at their centers. The joints between adjacent unit cells are compliant flexures capable of accommodating the different deformations required in each layer. The center of curvature in double-layered shape-shifting surfaces is on the side of the smaller unit cell. FIG. 9B is a top view of a pair of unit cells that, when tiled, produce intrinsic spherical curvature. FIG. 9C depicts a pair of unit cells that produce intrinsic hyperbolic curvature when tiled.

Figure 10A:
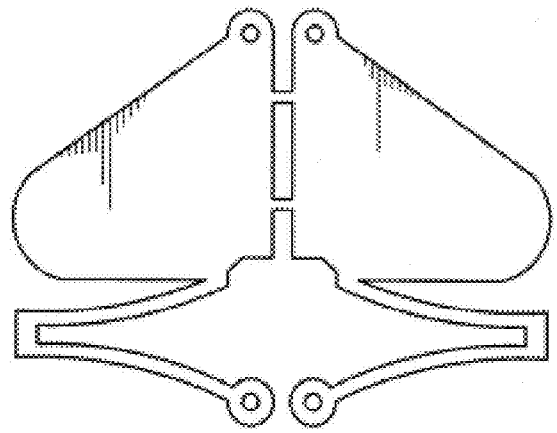
FIG. 10A depicts one of eight sets of compliant links that bend to make a cube.
Figure 10B:
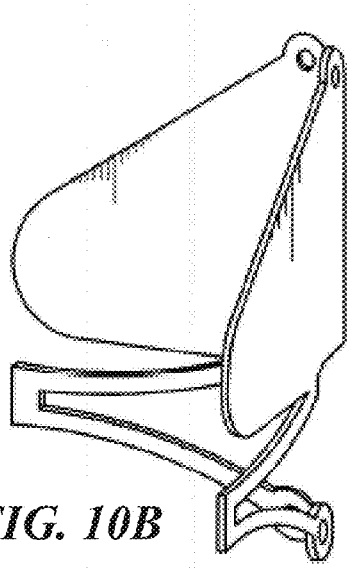
FIG. 10B depicts a compliant link bent at a 90-degree angle to allow assembly of the cube.
Figure 10C:
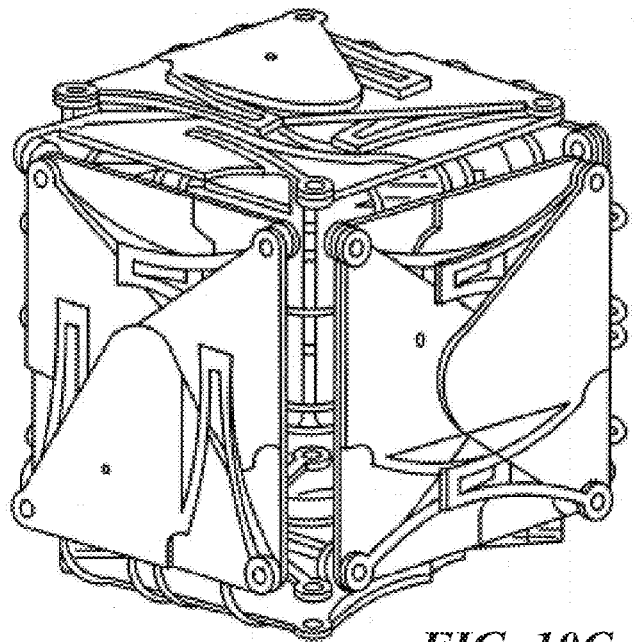
FIG. 10C depicts all twenty four (24) compliant links consisting of eight (8) different sets of three (3) identical links forming together to make a compliant cube.

FIG. 10 illustrates a polypropylene prototype of a curved shape-shifting surface, using double layers of dissimilar size.

Figure 11A:
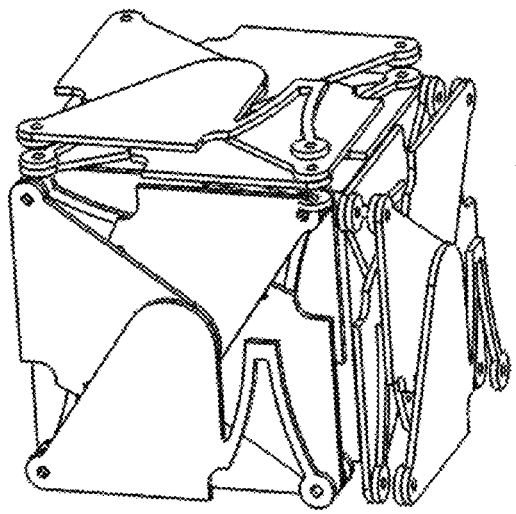
FIG. 11A depicts an unstressed cube.
Figure 11B:
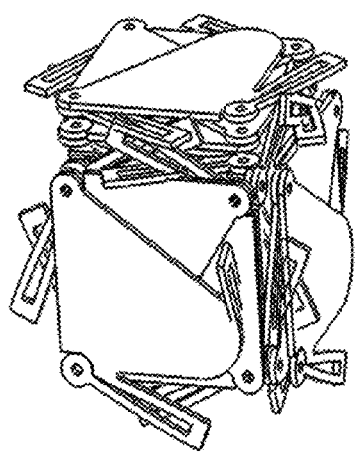
FIG. 11B depicts the cube of FIG. 11A in compression.
Figure 11C:
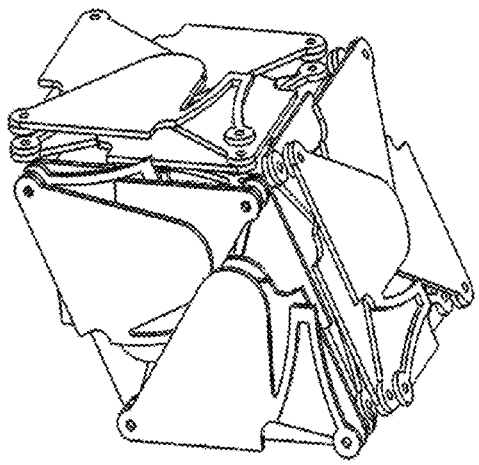
FIG. 11C depicts the cube of FIG. 11A in shear.
Figure 11D:
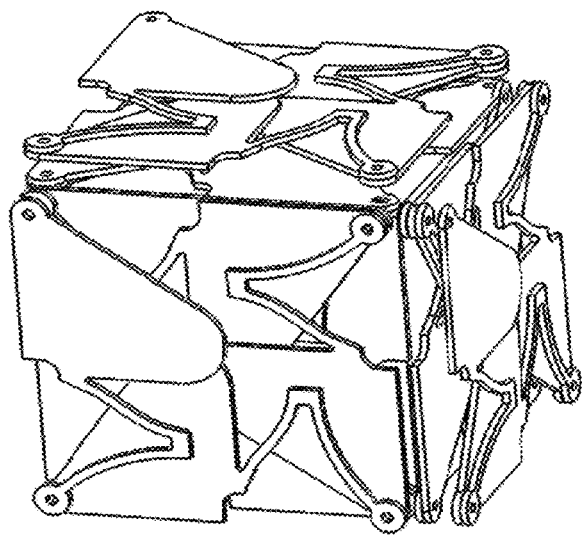
FIG. 11D depicts the tube of FIG. 11A in tension (expansion)

FIGS. 8A-B, 9A-C and 10 illustrate examples of shapes that are attainable by adding unit cells together. FIG. 11A depicts these planar faces connected together, allowing flexibility between adjacent faces. This "double wing" compliant link makes up the square unit cells that are joined together. The two compliant links in the middle allow the two "wings" to bend at a ninety degree (90°) angle to one another, allowing the formation of a cube. FIG. 11B depicts how this complaint link is bent prior to assembly. These two compliant links provide a torsional resistance as the angle between the two adjacent faces changes when the cube is sheared. A solid model of the cube obtained by joining these individual cells together is depicted in FIG. 11C.

In this cube, there are eight (8) different sets of three identical compliant links or side members made to form the cube. Set one, depicted in FIG. 11A, has the smallest distance between each wing. As each set increases from one to eight (1-8), the link distance between the wings increases linearly with respect to material thickness to allow for correct plane alignment. Each face of the individual unit cell, FIGS. 7A-D, contains eight (8) layers. Accordingly, there are eight (8) sets of these new links (FIGS. 11A-C) to allow for eight (8) overlapping planes.

Figure 12:
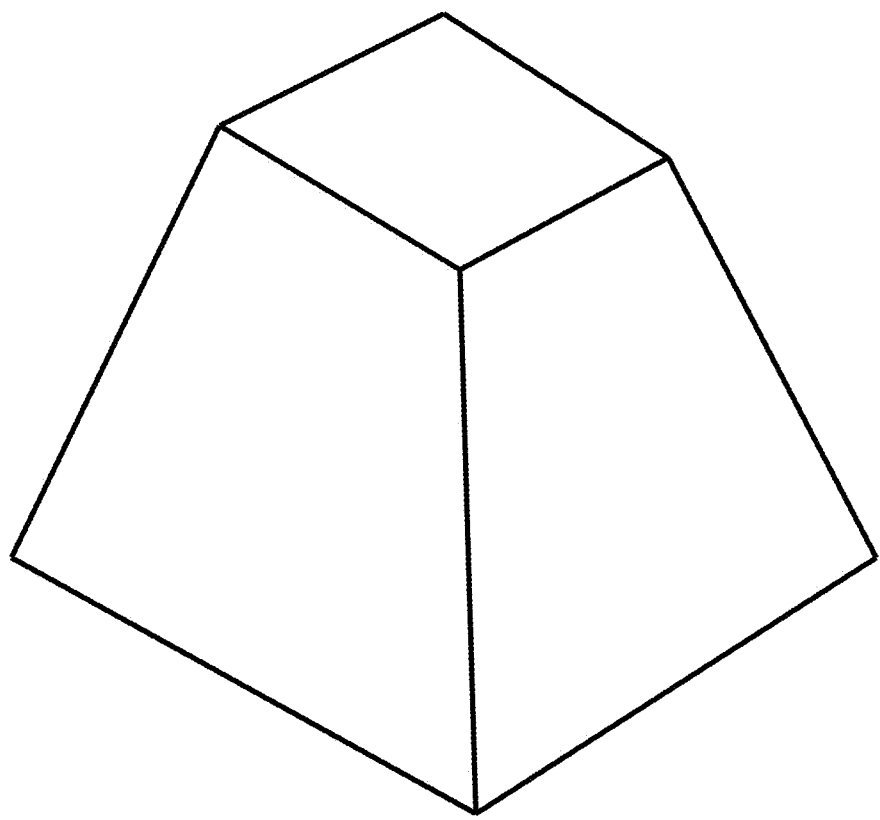
FIG. 12 depicts a cube with compressive forces at the top and tensile forces at the bottom that is deformed into a trapezoidal prism.

FIGS. 12A-D depict the different configurations of the cube showing compression, shear, and expansion. In FIG. 12A, the cube is unstressed. In FIG. 12B, the cube is compressed with elastic bands. There is a noticeable difference in size between the cube in its unstressed and compressed configurations as indicated in said FIGS. 12A and 12B. In FIG. 12C, the elastic bands are used to apply shear loads. In FIG. 12D, the cube is in tension. There is a noticeable size difference in this image as the cube expands due to the tensile loads. Other complex configurations are also possible.

In FIG. 13, the cube is compressed at the top, and is under tension at the bottom, resulting in a trapezoidal prism shape. Using these compliant links, depicted in FIGS. 11A-C, to connect the unit cells gives feasible methods of fabricating a wide variety of complex shapes, such as the polyhedral shape depicted in FIG. 1.

A shape-shifting surface may act as a physical barrier. For example, a shape-shifting surface used in biomedical applications may serve as a barrier against fluids. Thus, it may be important to evaluate barrier effectiveness as a function of the design parameters of the shape-shifting surface. The novel synthesis methodology subdivides the area covered by a unit cell and insures that overlaps prevent gaps in the surface from opening when the surface deforms. This is essentially a line-of-sight synthesis technique, and does not guarantee that the surface is a water-tight barrier. Labyrinth and diaphragm seals enhance the line-of-sight approach. Labyrinth seals make use of the friction in lengthy small passages to minimize and stop fluid flow. An elastomeric flexible membrane forms the barrier in diaphragm seals.

Surface integrity during a shape-shift depends on correct geometric and motion design in synergy with appropriate material choices. By including sensors that monitor the strength and nature of the loads on the surfaces, health monitoring, appropriate repair and, if necessary, redesign and replacement can be conducted to insure that surface integrity is maintained in the short and long term. The inclusion of actuators allows the surface to actively reshape or stiffen itself in order to respond to hazards that threaten the integrity of the surface. For example, with a shape-shifting surface implemented into extreme cold weather roofing systems, damage due to excess snow buildup can be prevented. Strain sensors in an innovative system can determine when the weight of the overlying snow is unsafe, and employ a shape-shift, such as a shrugging motion, to dislocate the snow from the roof while maintaining a physical barrier to keep the snow out of the roofed area.

Shape-shifting surfaces are compatible with finite element modeling. They can be used in the design of a specific planar shape-shift as well as in the design of out-of-plane curvature and flexibility.

It will thus be seen that the objects set forth above, and those made apparent from the foregoing disclosure, are efficiently attained. Since certain changes may be made in the above construction without departing from the scope of the invention, it is intended that all matters contained in the foregoing disclosure or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A unit cell shape shifting surface, comprising:
   a plurality of layers adjacent overlapping side members;
   said side members including compliant flexures and flat plate segments;
   said complaint flexures enabling substantially straight line motion;
   said overlapping side members being joined at nodes and being pivotal about said nodes, and
   said overlapping side members forming a contiguous line of sight barrier.

2. The shape shifting surface of claim 1, further comprising:
   each side member of said overlapping side members including a first node positioned at a free end of said compliant flexure and a second node at one corner of said plate segment.

3. The shape shifting surface of claim 2, further comprising:
   all edges of said shape shifting surface remaining substantially within the boundary of the structure during deformation of said shape shifting surface.

4. The shape shifting surface of claim 2, further comprising:
   said shape shifting surface returning to its original shape when said externally applied force is released.

5. The shape shifting surface of claim 1, further comprising:
   said shape shifting surface maintaining a contiguous line of sight barrier when deforming in response to application of an externally applied force.

6. The shape shifting surface of claim 1, further comprising:
   said plate segments being thin curved shells components.

7. A shape-shifting surface, comprising:
   a single polygonal cell;
   said single polygonal cell including compliant flexures attached to flat structures that retain their effectiveness as physical barriers while undergoing changes in shape;
   said changes in shape selected from a group of changes including expansion, shearing, shrinkage, twisting, vibrating, encircling, wiggling, swallowing or constricting.

8. The shape-shifting surface of claim 7, further comprising:
   said structures including overlapping thin plates.

9. The shape-shifting surface of claim 7, further comprising:
   said structures including overlapping thin shells.

10. The shape-shifting surface of claim 7, further comprising:
    said structures including an initial planar structure and a specific final shape.

11. The shape-shifting structure of claim 10, further comprising:
    said spatial structure selected from a group of shapes including spheres and cuboctohedrons.

12. A shape-shifting surface, comprising:
    a tiled array of polygonal cells;
    each polygonal cell of said tiled array including compliant flexures attached to flat structures that retain their effectiveness as physical barriers while undergoing changes in shape;
    said changes in shape selected from a group of changes including expansion, shearing, shrinkage, twisting, vibrating, encircling, wiggling, swallowing or constricting.

13. The shape-shifting surface of claim 12, further comprising:
    said structures including overlapping thin plates.

14. The shape-shifting surface of claim 12, further comprising:
    said structures including overlapping thin shells.

15. The shape-shifting surface of claim 12, further comprising:
    said structures including an initial planar structure and a specific final shape such as a spatial structure.

16. The shape-shifting structure of claim 15, further comprising:
    said spatial structure selected from a group of shapes including spheres and cuboctohedrons.

17. A shape-shifting surface as in claim 12, further comprising:
    a spatial structure formed of compliant mechanisms.

18. The shape-shifting surface of claim 17, further comprising:
    said spatial structure formed of a plurality of planar compliant mechanisms.

19. The shape-shifting surface of claim 18, further comprising:
    said spatial structure formed of a plurality of non-planar compliant mechanisms.

20. A shape-shifting surface as in claim 17, comprising:
    a truncated icosahedron.

21. The shape-shifting structure of claim 20, further comprising:
    said truncated icosahedron having planar faces.

22. The shape-shifting structure of claim 20, further comprising:
    said truncated icosahedron having spherical faces.

* * * * *

UNITED STATES PATENT AND TRADEMARK OFFICE
CERTIFICATE OF CORRECTION

PATENT NO. : 8,424,265 B2  
APPLICATION NO. : 13/302606  
DATED : April 23, 2013  
INVENTOR(S) : Lusk Page 1 of 1

It is certified that error appears in the above-identified patent and that said Letters Patent is hereby corrected as shown below:

In the Specification

Column 1, lines 12-15, Statement Regarding Government Interests should read:

This invention was made with Government support under Grant No. CMMI 1000138 awarded by the National Science Foundation. The government has certain rights in the invention.

Signed and Sealed this  
Tenth Day of September, 2013

Teresa Stanek Rea  
*Acting Director of the United States Patent and Trademark Office*